(12) United States Patent
Sano et al.

(10) Patent No.: US 6,815,697 B2
(45) Date of Patent: Nov. 9, 2004

(54) ION BEAM CHARGE NEUTRALIZER AND METHOD THEREFOR

(75) Inventors: Makoto Sano, Toyo (JP); Michiro Sugitani, Niihama (JP)

(73) Assignee: Sumitomo Eaton Nova Corporation, Tokyo (JP)

(*) Notice: Subject to any disclaimer, the term of this patent is extended or adjusted under 35 U.S.C. 154(b) by 113 days.

(21) Appl. No.: 10/397,536

(22) Filed: Mar. 27, 2003

(65) Prior Publication Data

US 2003/0183780 A1 Oct. 2, 2003

(30) Foreign Application Priority Data

Mar. 27, 2002 (JP) .................................. 2002-088122

(51) Int. Cl.[7] .......................... H01J 37/317; H05H 3/02
(52) U.S. Cl. ........................ 250/492.21; 250/492.2; 250/492.3; 250/423 R; 250/251; 315/111.81
(58) Field of Search ................ 250/492.21, 492.2, 250/492.3, 423 R, 251; 315/111.81

(56) References Cited

U.S. PATENT DOCUMENTS

| | | |
|---|---|---|
| 5,703,375 A | 12/1997 | Chen et al. |
| 6,271,529 B1 * | 8/2001 | Farley et al. .......... 250/492.21 |
| 2002/0100871 A1 * | 8/2002 | Aita ......................... 250/309 |

FOREIGN PATENT DOCUMENTS

| | | |
|---|---|---|
| GB | 2374199 A | 9/2002 |
| JP | 6-203788 | 7/1994 |
| JP | 7-176290 | 7/1995 |
| JP | 8-190887 | 7/1996 |
| JP | 9-147785 | 6/1997 |
| JP | 10-27569 | 1/1998 |
| JP | 2756704 | 3/1998 |
| JP | 10-172502 | 6/1998 |

OTHER PUBLICATIONS

Shigeki Sakai et al., A Low Energy Plasma Flood Gun Using RF Plasma Formation, R&D Group, Engineering & Production Dept., Nissin Ion Equipment Co., Ltd., pp. 592–595.

* cited by examiner

*Primary Examiner*—Nikita Wells
(74) *Attorney, Agent, or Firm*—Arent Fox PLLC

(57) ABSTRACT

In an ion beam line having a mechanism for scanning an ion beam by an electric field or a magnetic field or in an ion beam line having a mechanism for forming a sheet-like or a ribbon-like ion beam, electrons are confined by the use of cusp magnetic fields generated by arranging permanent magnets. In a direction intersecting a beam traveling direction and a beam scanning direction or in a direction intersecting the beam traveling direction and a beam spread direction of the sheet-like or the ribbon-like beam, the electrons are supplied to neutralize electric charges.

23 Claims, 5 Drawing Sheets

ION BEAM CHARGE NEUTRALIZER AND METHOD THEREFOR

This application claims priority to prior application JP 2002-88122, the disclosure of which is incorporated herein by reference.

BACKGROUND OF THE INVENTION

This invention relates to an ion beam charge neutralizer and an ion beam charge neutralizing method in an ion implanter having a mechanism for linearly and reciprocally scanning an ion beam by an electric field or a magnetic field. This invention also relates to an ion beam charge neutralizer and an ion beam charge neutralizing method in an ion implanter having a mechanism for forming a sheet-like or a ribbon-like ion beam through an ion extracting member or a beam line.

In production processes of semiconductor integrated circuits, ion implanters are widely used because impurities can be accurately and precisely introduced into a microscopic area on a surface of a wafer. Since the ion implanter implants charged ions, i.e., ions having electric charges, into the wafer to be processed, there arises a problem of charge accumulation (charge-up) onto the wafer.

Generally, the ions to be implanted have positive electric charges. Therefore, in order to suppress the charge-up, negative electric charges (electrons) are supplied. For example, use is made of a method of actively supplying electrons produced by collision of ions against a wall of a beam line and another method of supplying secondary electrons produced near the wafer by the use of an electron gun. Among others, a plasma shower (or a plasma flood gun) is widely used as a method capable of supplying electrons having relatively low energy.

In a batch-type ion implanter, the wafer is placed on a rotary disk adapted to perform linear reciprocal movement so as to enable ion implantation throughout an entire surface of the wafer. In this event, a beam trajectory or orbit is fixed with respect to the beam line. The plasma shower is disposed in the vicinity of the beam. By the potential of the beam, the electrons are supplied from the plasma shower.

Referring to FIG. 1, description will be made of an existing plasma shower used in the batch-type ion implanter.

A plasma generating gas 16 is introduced into an arc chamber 15. A filament 17 is heated by a power supply 18 and an arc voltage 19 is applied between the filament 17 and the arc chamber 15. As a consequence, a plasma is generated in the arc chamber 15. Setting is appropriately made so that an ion beam 28 is located in the vicinity of the arc chamber 15. Then, electrons are extracted by a potential built up by the ion beam 28 so that the charge-up by the beam is suppressed. By arranging a shower tube 37 and applying a negative potential 38 to the shower tube 37, it is possible to promote the supply of electrons from the arc chamber 15 to the beam.

On the other hand, in an ion implanter having a mechanism for scanning the beam by making the beam itself perform linear reciprocal movement, the relative position of the beam and the plasma shower is continuously varied. This makes it difficult to stably supply the electrons. In view of the above, various methods are proposed in order to stably supply the electrons from the plasma shower to the scanned beam.

For example, in order to promote the supply of electrons to the ion beam scanned in a wide area from an ion beam charge neutralizer, proposal is made of various methods of applying a magnetic field to a beam scanning area.

In a first conventional technique (JP 7-176290 A), an extracting hole of a plasma arc chamber is arranged in parallel to a beam scanning direction. The magnetic field is applied by coils in parallel to the beam scanning direction.

In a second conventional technique (JP 8-190887 A), the plasma arc chamber is arranged at the center of the beam scanning area to be perpendicular to the beam scanning direction. A magnetic field spreading outward from the center is applied by coils.

In a third conventional technique (JP 9-147785 A), the plasma arc chamber is arranged at the center of the beam scanning area to be perpendicular to the beam scanning direction. A magnetic field spreading outward from the center throughout a whole of the beam scanning area is applied by coils.

In a fourth conventional technique (JP 10-27569 A), the plasma arc chamber is arranged at the center of the beam scanning area to be perpendicular to the beam scanning direction. An a.c. magnetic field synchronized with the beam reciprocation is applied by coils in parallel to the beam scanning direction.

In a fifth conventional technique (JP 10-172502 A), the third conventional technique is improved by providing an electric field for electron reflection. Furthermore, a magnetic field is applied in parallel to the beam scanning direction.

In each of the above-mentioned plasma showers, the supply of the electrons may be unintentionally prevented because the applied magnetic field itself excessively constrains or binds the electrons in some cases. In order to avoid such prevention of the supply of the electrons, the magnetic field must accurately and precisely be generated. However, it is not always easy to generate a magnetic field exactly as desired.

In order to synchronize beam reciprocation and the magnetic field, a complicated mechanism is required to form a circuit. In addition, it is difficult to confirm whether or not the trajectory of the electrons is controlled in the manner exactly as desired. Furthermore, in case where the coil is used, the mechanism itself is increased in scale.

As a sixth conventional technique (S. Sakai et al., International Conference on Ion Implantation Technology Proceedings, September 2000, pp. 592595), a radio frequency antenna is used to generate a plasma covering a wide area. In this event, a large-scale and complicated mechanism is required to produce, propagate, and control a radio frequency wave.

As a method of supplying the electrons extracted from the plasma arc chamber to the beam after the electrons are introduced into a secondary chamber, proposal is made of the following techniques.

In a seventh conventional technique (JP 2756704 B), a mesh-type electrode is arranged in the secondary chamber for the purpose of exclusively supplying low-energy electrons to the ion beam.

In an eighth conventional technique (JP 6-203788 A), low-energy secondary electrons produced as a result of collision of the extracted electrons against a wall of the secondary chamber are supplied to the ion beam by applying a magnetic field.

However, the seventh and the eighth conventional techniques are addressed to the batch-type ion implanter and do not intend the supply of electrons over a wide area.

SUMMARY OF THE INVENTION

It is therefore an object of this invention to provide a charge neutralizer, a charge neutralizing method, and an ion implanter comprising the charge neutralizer, which neutralizer is capable of stably supplying electrons to a scanned ion beam over a wide area by confining the electrons by the use of cusp magnetic fields generated by arranging a plurality of sets of permanent magnets.

It is another object of this invention to provide a charge neutralizer, a charge neutralizing method, and an ion implanter comprising the charge neutralizer, which neutralizer is capable of stably supplying electrons to a whole of a sheet-like or a ribbon-like ion beam over a wide area by confining the electrons by the use of cusp magnetic fields generated by arranging a plurality of sets of permanent magnets.

According to this invention, there is provided an ion beam charge neutralizer, in which electrons extracted from an arc chamber and pooled in an electron accumulating member are uniformly supplied throughout an entire area of a scanning area of the parallelized ion beam, which is extracted from an ion source as a normal ion beam, and the extracted normal ion beam is reciprocally scanned over a specific range in accordance with continuous-variable control drive of an electric field or a magnetic field, and the scanned ion beam is parallelized with an electric field or a magnetic field, and the parallelized ion beam is traveling towards a target object and comes down to the target object, the parallelized ion beam is neutralizing by the electrons that are supplied from the ion beam charge neutralizer.

According to this invention, there is also provided an ion beam charge neutralizing method, in which electrons extracted from an arc chamber and pooled in an electron accumulating member are uniformly supplied throughout an entire area of a scanning area of the parallelized ion beam, which is extracted from an ion source as a normal ion beam, and the extracted normal ion beam is reciprocally scanned over a specific range in accordance with continuous-variable control drive of an electric field or a magnetic field, and the scanned ion beam is parallelized with an electric field or a magnetic field, and the parallelized ion beam is traveling towards a target object and comes down to the target object, the parallelized ion beam is neutralizing by the electrons that are supplied from the ion beam charge neutralizer.

According to this invention, there is also provided an ion implanter comprising an ion beam charge neutralizer, in which-electrons extracted from an arc chamber and pooled in an electron accumulating member are uniformly supplied throughout an entire area of a scanning range area of the parallelized ion beam, which is extracted from an ion source as a normal ion beam, and the extracted normal ion beam is reciprocally scanned over a specific range in accordance with continuous-variable control drive of an electric field or a magnetic field, and the scanned ion beam is parallelized with an electric field or a magnetic field, and the parallelized ion beam is traveling towards a target object and is implanted onto the target object, the parallelized ion beam is neutralizing by the electrons that is supplied from the ion beam charge neutralizer.

According to this invention, there is also provided an ion beam charge neutralizer, in which electrons extracted from an arc chamber and pooled in an electron accumulating member are uniformly supplied throughout an entire area of a spread range of a sheet-like or a ribbon-like ion beam, which is extracted from an ion extracting member wide in one direction or is formed by enlarging a beam width on a beam line by an electric field or a magnetic field.

According to this invention, there is also provided an ion beam charge neutralizing method, in which electrons extracted from an arc chamber and pooled in an electron accumulating member are uniformly supplied throughout an entire area of a spread range of a sheet-like or a ribbon-like ion beam, which is extracted from an ion extracting member wide in one direction or is formed by enlarging a beam width on a beam line by an electric field or a magnetic field.

According to this invention, there is also provided an ion implanter comprising an ion beam charge neutralizer, in which electrons extracted from an arc chamber and pooled in an electron accumulating member are uniformly supplied throughout an entire area of a spread range of a sheet-like or a ribbon-like ion beam, which is extracted from an ion extracting member wide in one direction or is formed by enlarging a beam width on a beam line by an electric field or a magnetic field.

In the above-mentioned ion beam charge neutralizer according to this invention, the electrons are supplied in a third direction intersecting a beam traveling direction and a beam scanning direction to thereby neutralize electric charges of the ion beam.

In the above-mentioned ion beam charge neutralizer according to this invention, the electrons are supplied in a third direction intersecting a beam traveling direction and a beam spread direction of the sheet-like or the ribbon-like beam to thereby neutralize electric charges of the ion beam.

In the above-mentioned ion beam charge neutralizer according to this invention, the electrons for charge neutralization are produced by introducing a discharge gas into a plasma generating chamber so that arc discharge is caused by heating a filament and by applying an arc voltage in the plasma generating chamber to generate a plasma and the electrons are extracted from an extraction port of the plasma generating chamber by applying an electric field.

In the above-mentioned ion beam charge neutralizer according to this invention, the electrons for charge neutralization are supplied to the ion beam through an intermediate chamber as an electron accumulating member after the electrons are extracted from the plasma generating chamber and pooled in the intermediate chamber.

In the above-mentioned ion beam charge neutralizer according to this invention, the electrons for charge neutralization are supplied to the ion beam through an intermediate chamber as an electron accumulating member after the electrons are extracted from the plasma generating chamber and pooled in the intermediate chamber, which acts as an electron confinement area under cusp magnetic fields formed by permanent magnets. The intermediate chamber accumulates a large amount of electrons and supplies the electrons to the ion beam.

In the above-mentioned ion beam charge neutralizer according to this invention, a large amount of the electrons for charge neutralization accumulated in the intermediate chamber are extracted through a slit electrode or a multihole electrode having a series of holes to be supplied to the beam.

In the above-mentioned ion beam charge neutralizer according to this invention, the slit electrode or the multihole electrode is arranged on one side or both sides of the beam to be substantially coincident with a beam scanning direction for the scanned beam or to be substantially coincident with a beam spread direction for the sheet-like or the ribbon-like beam.

In the above-mentioned ion beam charge neutralizer according to this invention, the intermediate chamber as an electron confinement area under the cusp magnetic field is adapted to be applied with an electric voltage for promotion of electron supply to the ion beam.

In the above-mentioned ion beam charge neutralizer according to this invention, the slit electrode or the multihole electrode is adapted to be applied with an electric voltage for extraction of the electrons.

In the above-mentioned ion beam charge neutralizer according to this invention, a beam guide tube is adapted to be applied with a voltage for reflection of the electrons.

In the above-mentioned ion beam charge neutralizer according to this invention, the confinement area by the cusp magnetic fields is formed by placing permanent magnets in each of walls inside the intermediate chamber.

The ion implanter according to this invention comprises a plasma shower mechanism for easily and stably supplying electrons to a whole of a scanned beam or a sheet-like or a ribbon-like beam by introducing cusp magnetic fields. Generally, the cusp magnetic field is used to confine charged particles in anion source or the like. In this invention, the cusp magnetic field is mainly used to confine electrons and to equalize the concentration of the electrons over a wide area.

By the use of this invention, in an ion implanter having a beam scanning mechanism, it is possible to achieve a charge-up suppressing function sufficient for a device production process. This invention is also applicable to an ion implanter having a mechanism for forming a sheet-like or a ribbon-like beam.

DESCRIPTION OF THE PREFERRED EMBODIMENT

Figure 1:
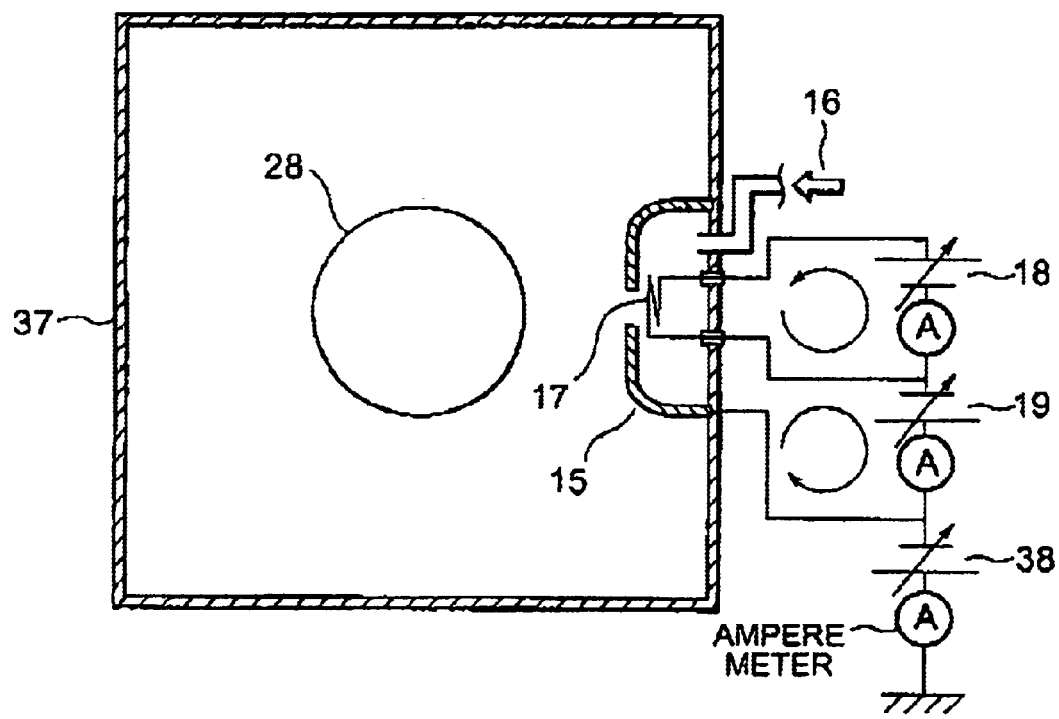
FIG. 1 is a schematic diagram of an existing plasma shower used in a batch-type ion implanter.
Figure 2A:
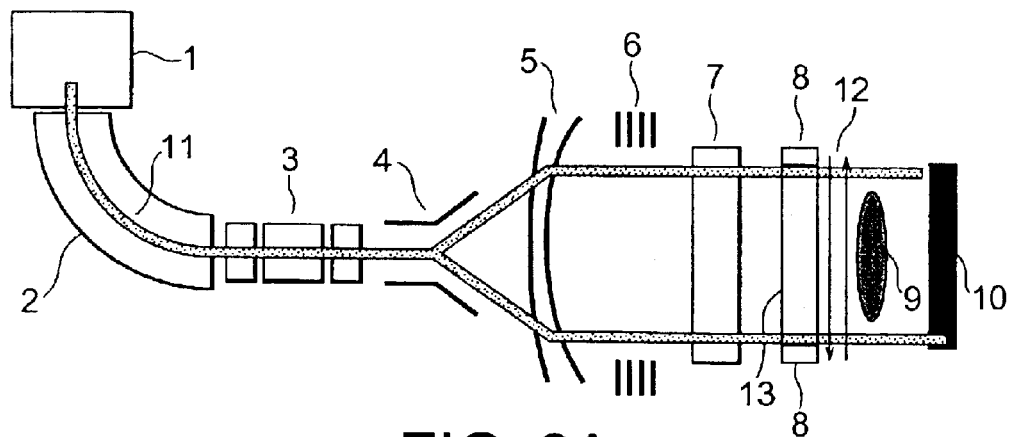
FIGS. 2A through 2C are schematic diagrams for describing ion implanters to which this invention is applicable, FIGS. 2A and 2B being a top sectional view and a side sectional view of a beam scanning-type ion implanter, respectively, FIG. 2C being a top sectional view of a wide beam type ion implanter.
Figure 2B:
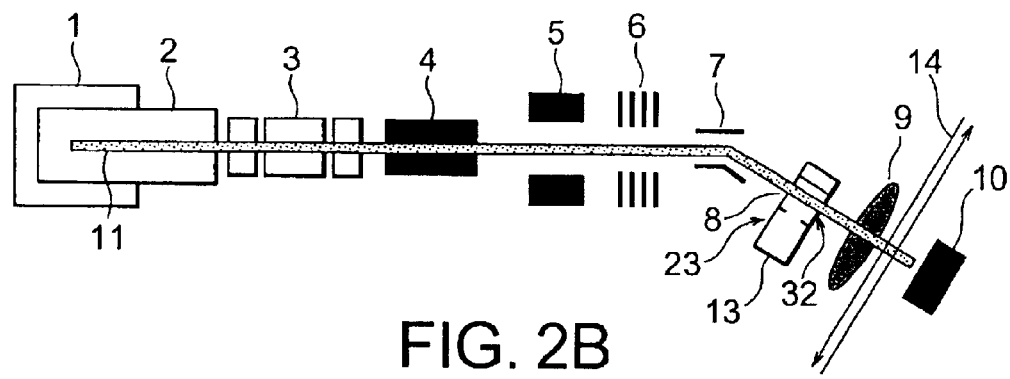
Figure 2C:
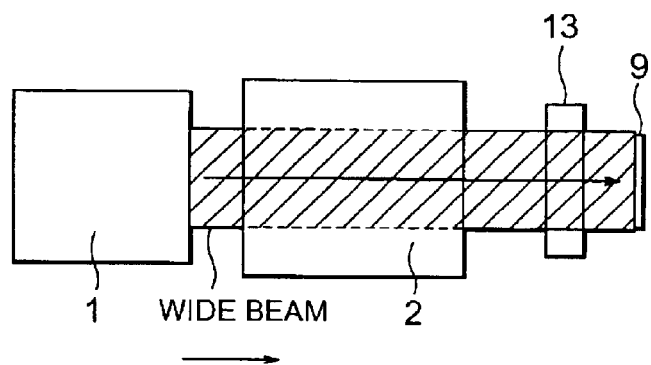

Referring to FIGS. 2A through 2C, description will be made of ion implanters to which this invention is applicable.

An ion source 1 generates a plasma by arc discharge. By applying an electric field, ions are extracted and accelerated. The accelerated ions 11 are transported to a mass-analyzing or mass-selecting electromagnet 2 to select those ions having a predetermined weight. The selected ions are shaped into a beam. Quadrupole lenses 3 adjust a beam focus. The beam is scanned by applying a couple of voltages on scanning electrodes 4.

The scanned beam is parallelized by an electric field 5, accelerated or decelerated by an electric field 6, and deflected by an electric field of an energy filter 7 to be injected into a wafer 9. The wafer 9 performs translational movement 14 across the beam performing scanning movement 12. Thus, the ions are implanted throughout an entire area of the wafer 9.

A part of the beam is monitored by a couple of dose cups 8 to control the amount of ions to be implanted. Those ions which are not implanted to the wafer 9 are received by a beam stopper 10.

An ion beam charge neutralizer 13 according to this invention is located upstream of the wafer 9 and supplies the electrons to thereby suppress positive charge-up by ion implantation.

Figure 3:
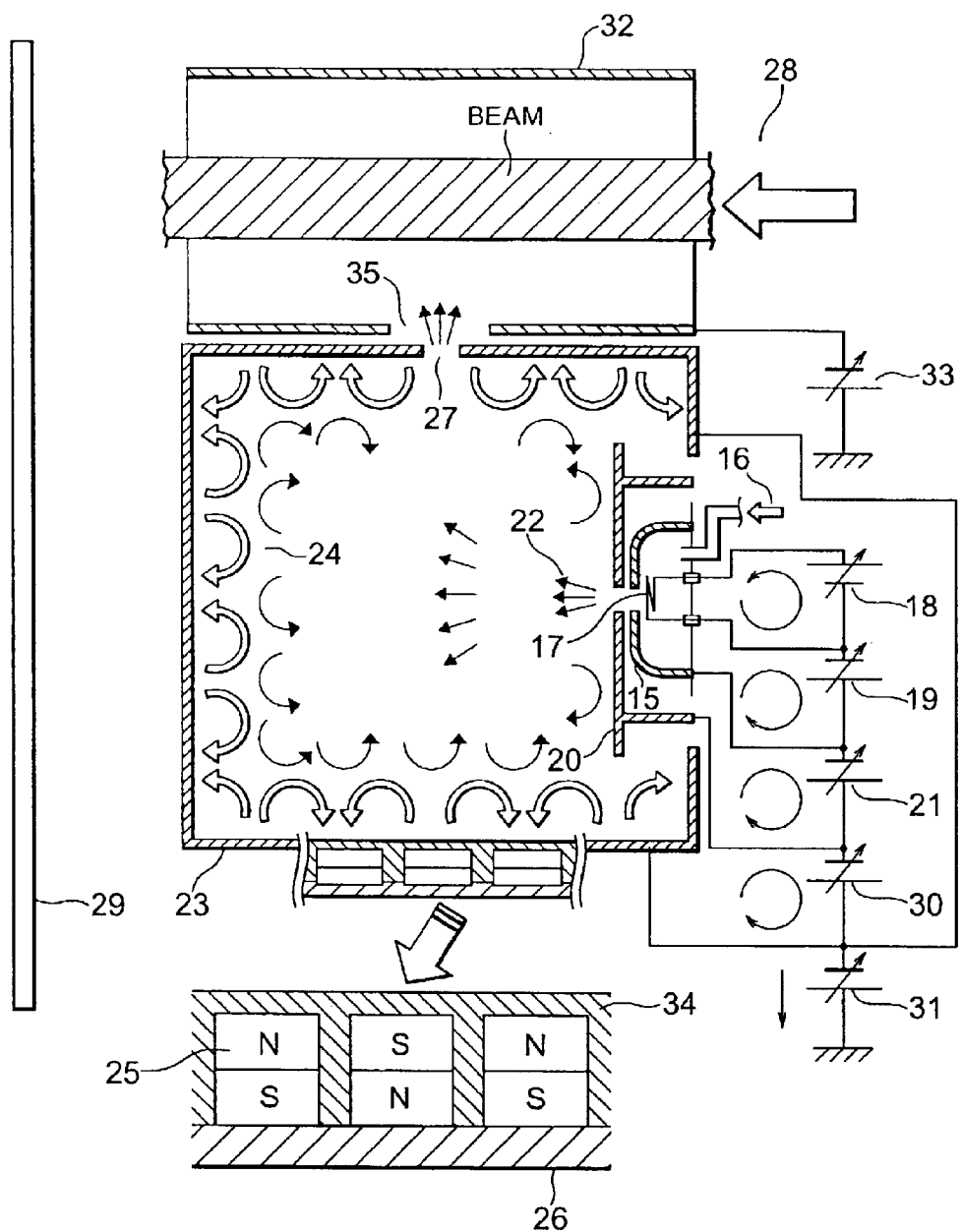
FIG. 3 is a side sectional view of a charge neutralizer according to this invention.
Figure 4:
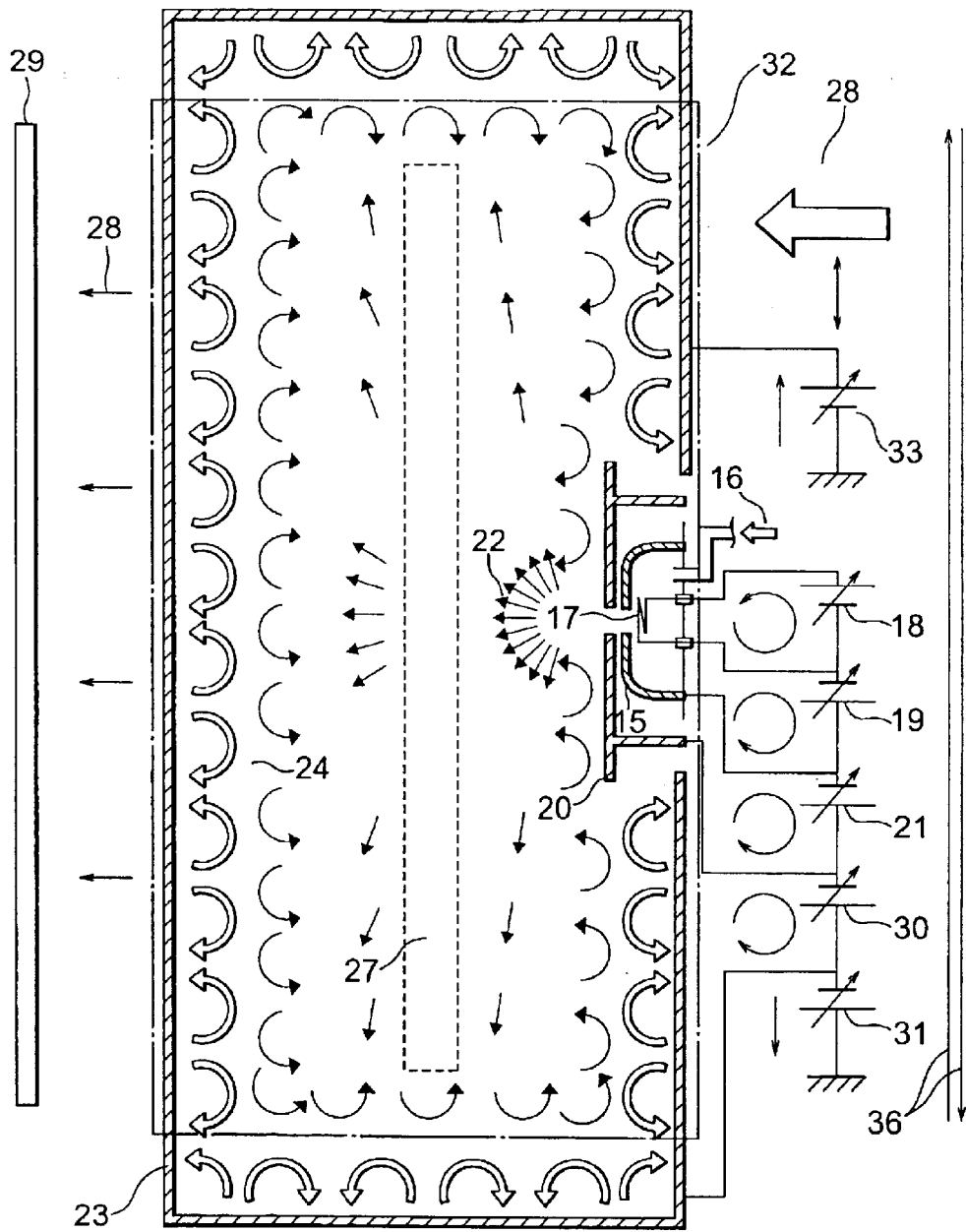
FIG. 4 is a top sectional view of the charge neutralizer illustrated in FIG. 3.
Figure 5:
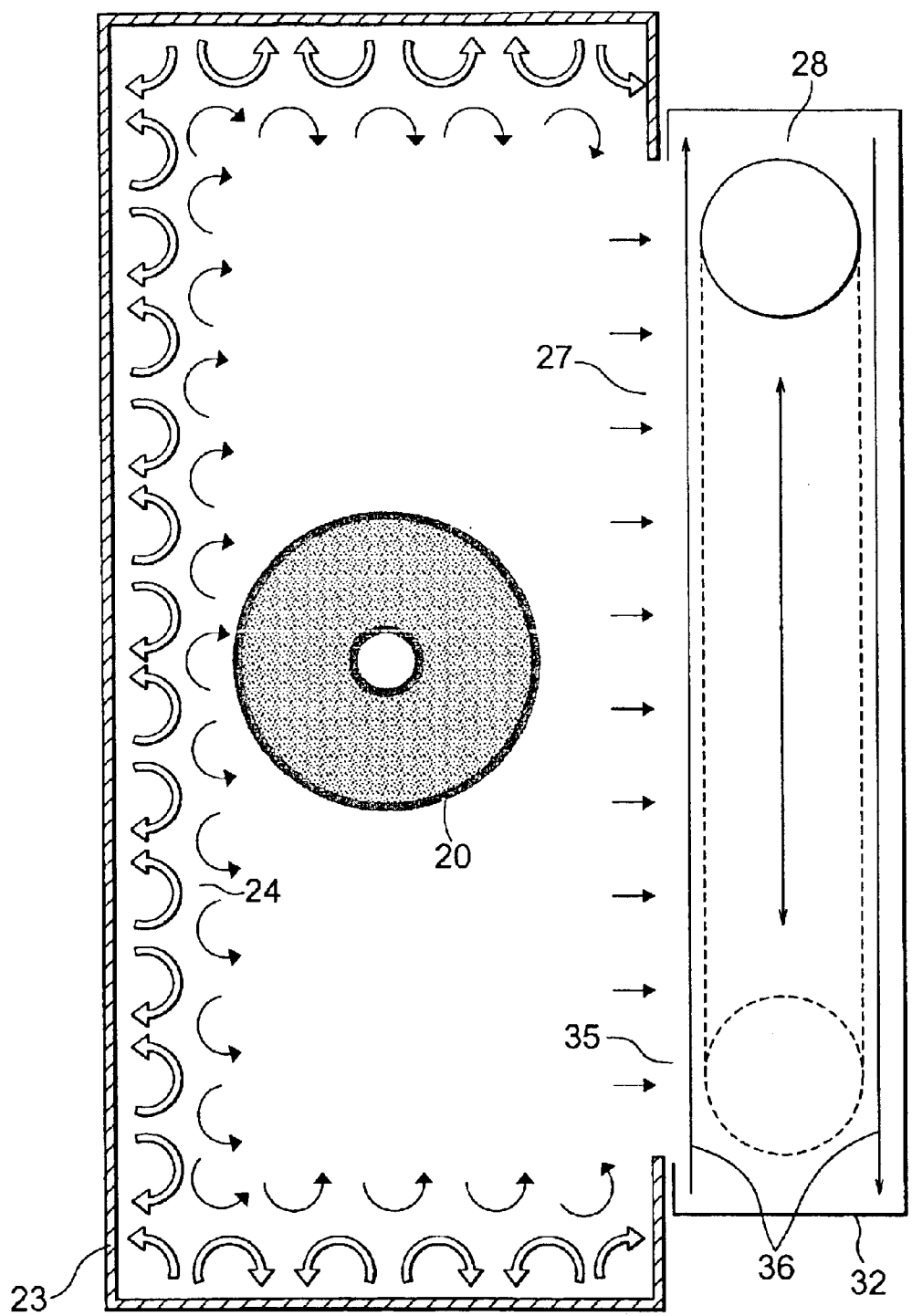
FIG. 5 is a sectional view of the charge neutralizer illustrated in FIG. 3 as seen in a beam traveling direction.

Referring to FIGS. 3 through 5, description will be made of this invention.

A method of producing a plasma using an arc chamber is similar to that of the conventional techniques. In this invention, electron confinement by cusp magnetic fields is introduced as a new concept or idea. By the electron confinement, it is possible to achieve electron distribution spread over a wide area. In the figures, the arc chamber is placed at the center on an upstream side of the beam. However, as far as electrons can be extracted, the arc chamber may be placed at any position on a wall. The number of arc chambers is not restricted to one but a plurality of arc chambers may be provided.

A plasma generating gas 16 is introduced into an arc chamber 15. By heating a filament 17 with a power supply 18 and by applying an arc voltage 19 between the filament 17 and the arc chamber 15, a plasma is generated in the arc chamber 15. By applying an electron extraction voltage 21 between the arc chamber 15 and an electron extraction electrode 20, only electrons 22 are extracted from the arc chamber 15 through an extraction port.

The electrons 22 are confined in the interior of a confining chamber 23 under cusp magnetic fields 24. The cusp magnetic fields 24 are generated by a plurality of permanent magnets 25 embedded in walls of the confining chamber 23 in an appropriate arrangement. The magnetic fields towards the outside of the confining chamber 23 are shielded by yokes 26. The walls of the confining chamber 23 are formed by Al frames 34. The permanent magnets 25 are held by the Al frames 34.

The permanent magnets 25 generate the cusp magnetic fields 24 by alternately arranging N poles and S poles. The width of the permanent magnets is on the order of 2 to 10 mm. For example, the arrangement of the permanent magnets 25 may be a two dimensional arrangement of button-like magnets or a one-dimensional arrangement of strip-like magnets.

Since the magnets can not be embedded around the arc chamber 15, a negative potential 30 is applied between the extraction electrode 20 and the confining chamber 23 to reflect the electrons. The confined electrons spread throughout the interior of the confining chamber 23. A part of the electrons is extracted through a slit or a multihole 27 and 35 formed on one wall of the confining chamber 23 under a potential built up by the ion beam 28 (a scanned beam or a sheet-like (ribbon-like) beam) to reach a surface of a wafer 29.

By appropriately setting the strength, the size, and the position of each of the magnets and the thickness of the walls, only high-energy electrons collide against the walls of the confining chamber 23 while low-energy electrons are confined in the interior of the confining chamber 23. It is also possible to extract these low-energy electrons from the confining chamber 23.

By applying a negative potential 31 to the confining chamber 23, it is possible to promote leakage of electrons through the slit or the multihole 27 and 35. By applying a negative potential 33 to a beam guide tube 32, it is possible to reflect those electrons ejected through the slit or the multihole 27 and 35 but failed to be trapped by the beam potential, thereby promoting the supply of electrons to the beam.

In case where the supply of electrons is excessive, the negative potentials 30, 31, and 33 are adjusted to thereby suppress the supply of electrons.

In the foregoing embodiment, an existing filament-arc discharge type chamber is used in order to generate the plasma. As compared with a mechanism for generating a plasma by the use of the radio frequency wave, the structure is considerably simple.

The arc chamber 15 has an opening on the order of 0.5–2 mmφ. Therefore, even if outgas is produced during implantation into a wafer with a photoresist film, internal pressure inside the arc chamber 15 is hardly affected. Thus, the stability of arc in the arc chamber 15 is increased and the amount of the introduced gas 16 can be decreased. If the introduced gas 16 is further reduced in amount, the variation in dose is suppressed and is negligible.

The cusp magnetic fields 24 can be designed and positioned with high accuracy and is hardly affected by maintenance or the like. By arranging the arc chamber 15 so that its opening is not faced towards the slit or the multihole 27 and 35, it is possible to reduce metal contamination derived from the filament 17.

Since the components of the plasma shower are not arranged in an area directly irradiated with the beam, contaminants resulting from deposition are hardly attached even if the plasma shower is used for along time. It is therefore possible to lengthen a maintenance cycle or interval.

By changing the voltages 18, 19, and 21 and the negative potentials 30, 31, and 33, it is possible to control the amount of the electrons to be supplied.

The confining chamber 23 may be provided with a plasma generating chamber having a plurality of extraction ports or a long extraction port along the beam scanning direction 36. With this structure, a greater amount of electrons can be supplied.

This invention is applicable not only to the scanned beam but also to a sheet-like or a ribbon-like beam.

In this invention, electron confinement is carried out by the use of the cusp magnetic fields generated by arranging the permanent magnets. This makes it possible to supply the electrons over a wide area. As a consequence, it is possible to stably supply the electrons throughout a whole of the scanned beam (or a whole of the sheet-like or the ribbon-like beam).

What is claimed is:

1. An ion beam charge neutralizer, wherein:
by applying electron extraction voltage to an electron extraction electrode with an arc chamber for plasma generation, only electrons are extracted from said plasma generated arc chamber into an electron accumulating chamber, and said extracted electrons are pooled in said electron accumulating chamber and said pooled electrons are uniformly supplied throughout an entire area of a scanning area of a parallelized ion beam, which is extracted from an ion source as a normal ion beam, and the extracted normal ion beam is reciprocally scanned over a specific range in accordance with continuous-variable control drive of an electric field or a magnetic field, and the scanned ion beam is parallelized with an electric field or a magnetic field, and the parallelized ion beam is traveling towards a target object and comes down to said target object, said parallelized ion beam is neutralized by said electrons that are supplied from said electron accumulating chamber of said ion beam charge neutralizer.

2. An ion beam charge neutralizer, wherein:
only electrons are extracted from an arc chamber for plasma generation and said extracted electrons are pooled in an electron accumulating chamber, and said pooled electrons are uniformly supplied throughout an entire area of a spread range of a sheet-like or a ribbon-like ion beam, which is extracted from an ion extracting member wide in one direction or is formed by enlarging a beam width on a beam line by an electric field or a magnetic field.

3. An ion beam charge neutralizer according to claim 1, wherein:
the electrons are supplied in a third direction intersecting a beam traveling direction and a beam scanning direction to thereby neutralize electric charges of the ion beam.

4. An ion beam charge neutralizer according to claim 1 or 2, wherein:
the electrons for charge neutralization are produced by introducing a discharge gas into a plasma generating chamber so that arc discharge is caused by heating of a filament and by applying an arc voltage in the plasma generating chamber to generate a plasma and the electrons are extracted from an extraction port of the plasma generating chamber by applying an electric field.

5. An ion beam charge neutralizer according to claim 1 or 2, wherein:
the electrons for charge neutralization are supplied to the ion beam through an intermediate chamber as an electron accumulating member after the electrons are extracted from the plasma generating chamber and pooled in the intermediate chamber.

6. An ion beam charge neutralizer according to claim 5, wherein:
a large amount of the electrons for charge neutralization accumulated in the intermediate chamber are extracted through a slit electrode or a multihole electrode having a series of holes to be supplied to the beam.

7. An ion beam charge neutralizer according to claim 6, wherein:
the slit electrode or the multihole electrode is arranged on one side or both sides of the beam to be substantially coincident with a beam scanning direction for the scanned beam or to be substantially coincident with a beam spread direction for the sheet-like or the ribbon-like beam.

8. An ion beam charge neutralizer according to claim 6, wherein:
the intermediate chamber as an electron confinement area under the cusp magnetic fields is adapted to be applied with an electric voltage for promotion of electron supply to the ion beam.

9. An ion beam charge neutralizer according to claim 6, wherein:
the slit electrode or the multihole electrode is adapted to be applied with an electric voltage for extraction of the electrons.

10. An ion beam charge neutralizer according to claim 6, wherein:
a beam guide tube is adapted to be applied with an voltage for reflection of the electrons.

11. An ion beam charge neutralizer as claimed in claim 6, wherein:
the confinement area by the cusp magnetic fields is formed by placing permanent magnets in each of walls inside the intermediate chamber.

12. An ion beam charge neutralizer according to claim 1 or 2, wherein:

the electrons for charge neutralization are supplied to the ion beam through an intermediate chamber as an electron accumulating member after the electrons are extracted from the plasma generating chamber and pooled in the intermediate chamber, which acts as an electron confinement area under cusp magnetic fields formed by permanent magnets, and accumulates a large amount of electrons, and supplies the electrons to the ion beam.

13. An ion beam charge neutralizer according to claim 12, wherein:

a large amount of the electrons for charge neutralization accumulated in the intermediate chamber are extracted through a slit electrode or a multihole electrode having a series of holes to be supplied to the beam.

14. An ion beam charge neutralizer according to claim 13, wherein:

the slit electrode or the multihole electrode is arranged on one side or both sides of the beam to be substantially coincident with a beam scanning direction for the scanned beam or to be substantially coincident with a beam spread direction for the sheet-like or the ribbon-like beam.

15. An ion beam charge neutralizer according to claim 13, wherein:

the intermediate chamber as an electron confinement area under the cusp magnetic fields is adapted to be applied with an electric voltage for promotion of electron supply to the ion beam.

16. An ion beam charge neutralizer according to claim 13, wherein:

the slit electrode or the multihole electrode is adapted to be applied with an electric voltage for extraction of the electrons.

17. An ion beam charge neutralizer according to claim 13, wherein:

a beam guide tube is adapted to be applied with an voltage for reflection of the electrons.

18. An ion beam charge neutralizer as claimed in claim 13, wherein:

the confinement area by the cusp magnetic fields is formed by placing permanent magnets in each of walls inside the intermediate chamber.

19. An ion beam charge neutralizer according to claim 2, wherein:

the electrons are supplied in a third direction intersecting a beam traveling direction and a beam spread direction of the sheet-like or the ribbon-like beam to thereby neutralize electric charges of the ion beam.

20. An ion beam charge neutralizing method, wherein:

by applying electron extraction voltage to an electron extraction electrode with an arc chamber for plasma generation, only electrons are extracted from said plasma generated arc chamber into an electron accumulating chamber, and said extracted electrons are pooled in said electron accumulating chamber and said pooled electrons are uniformly supplied throughout and entire area of a scanning area of a parallelized ion beam, which is extracted from an ion source as a normal ion beam, and the extracted normal ion beam is reciprocally scanned over a specific range in accordance with continuous-variable control drive of an electric field or a magnetic field, and the scanned ion beam is parallelized with an electric field or a magnetic field, and the parallelized ion beam is traveling towards a target object and comes down to said target object, said parallelized ion beam is neutralized by said electrons that are supplied from said electron accumulating chamber of said ion beam charge neutralizer.

21. An ion implanter comprising an ion beam charge neutralizer, wherein:

by applying electron extraction voltage to an electron extraction electrode with an arc chamber for plasma generation, only electrons are extracted from said plasma generated arc chamber into an electron accumulating chamber, and said extracted electrons are pooled in said electron accumulating chamber and said pooled electrons are uniformly supplied throughout an entire area of a scanning area of a parallelized ion beam, which is extracted from an ion source as a normal ion beam, and the extracted normal ion beam is reciprocally scanned over a specific range in accordance with continuous-variable control drive of an electric field or a magnetic field, and the scanned ion beam is parallelized with an electric field or a magnetic field, and the parallelized ion beam is traveling towards a target object and is implanted onto said target object, said parallelized ion beam is neutralized by said electrons that is supplied from said electron accumulating chamber of said ion beam charge neutralizer.

22. An ion beam charge neutralizing method, wherein:

only electrons are extracted from an arc chamber for plasma generation and said extracted electrons are pooled in an electron accumulating chamber, and said pooled electrons are uniformly supplied throughout an entire area of a spread range of a sheet-like or a ribbon-like beam, which is extracted from an ion extracting member wide in one direction or is formed by enlarging a beam width on a beam line by an electric field or a magnetic field.

23. An ion implanter comprising an ion beam charge neutralizer, wherein:

only electrons are extracted from an arc chamber for plasma generation and said extracted electrons are pooled in an electron accumulating chamber, and said pooled electrons are uniformly supplied throughout an entire area of a spread range of a sheet-like or a ribbon-like ion beam, which is extracted from an ion extracting member wide in one direction or is formed by enlarging a beam width on a beam line by an electric field or a magnetic field.

* * * * *